United States Patent
Kiriaki (12)

(10) Patent No.: US 6,337,648 B1
(45) Date of Patent: Jan. 8, 2002

(54) MOS TRANSISTOR DIGITAL-TO-ANALOG CONVERTER

(75) Inventor: Sami Kiriaki, Garland, TX (US)

(73) Assignee: Texas Instruments Inc., Dallas, TX (US)

( * ) Notice: Subject to any disclaimer, the term of this patent is extended or adjusted under 35 U.S.C. 154(b) by 0 days.

(21) Appl. No.: 09/440,015

(22) Filed: Nov. 12, 1999

Related U.S. Application Data

(60) Provisional application No. 60/109,777, filed on Nov. 25, 1998.

(51) Int. Cl.[7] .................................................. H03M 1/78
(52) U.S. Cl. ........................................ 341/154; 341/144
(58) Field of Search ................................ 341/136, 133, 341/154, 144

(56) References Cited

U.S. PATENT DOCUMENTS

| | | | | |
|---|---|---|---|---|
| 4,885,547 A | * | 12/1989 | Bell, Jr. et al. ............. | 330/254 |
| 5,402,126 A | * | 3/1995 | White ........................ | 341/154 |
| 5,446,457 A | * | 8/1995 | Ryat ............................ | 341/136 |
| 5,519,397 A | * | 5/1996 | Chapotot et al. ........... | 341/155 |
| 5,798,723 A | * | 8/1998 | Fong ........................... | 341/136 |
| 5,914,827 A | * | 6/1999 | Yamasaki et al. ........... | 360/27 |

* cited by examiner

Primary Examiner—Peguy Jeanpierre

(57) ABSTRACT

A monolithic, low power, digital-to-analog converter (DAC) circuit which uses an efficient transistor element to perform both switching and resistive current division functions simultaneously. This allows a R-2R type ladder network to be built using only conventional MOS transistors which can both switch and accurately divide current among the branches of the ladder network, without the need for separate resistors. The lower parts count and requirement for MOS transistors only, without the need for separate resistors, makes this circuit very compatible with low cost monolithic implementation. The DAC of this patent is useful in an application requiring the multiplication of two analog signals, where one of the signals is presented as a digital word. In this application, a Gilbert multiplier circuit is used to multiply the two signals, $V_{dig}$ and $V_{sig}$, where $V_{dig}$ represents the binary-weighted discrete levels from the DAC and $V_{sig}$ is a continuous analog signal. Additionally, in order to obtain linear multiplication over a wide range, the Gilbert multiplier requires the use of a predistortion circuit in conjunction with the $V_{dig}$ signal coming from the DAC to compensate for the logarithmic current-voltage transfer function of this circuit.

4 Claims, 5 Drawing Sheets

MOS TRANSISTOR DIGITAL-TO-ANALOG CONVERTER

This application is a continuation of application Ser. No. 60/109,777, filed Nov. 25, 1998.

BACKGROUND OF THE INVENTION

1. Field of the Invention

This invention relates to a low power, monolithically implemented, Digital-to-Analog Converter (DAC) circuit in general and, in one aspect, to the use of this circuit to satisfy the pre-distortion requirements of a four-quadrant Gilbert multiplier in applications for the multiplication of two signals; one being represented as the discrete binary levels of a digital word from the DAC and the other being a continuous analog signal.

2. Brief Description of the Known Art

Binary-weighted Digital-to-Analog Converters (DAC) commonly use a form of resistive network, such as the R-2R ladder 100. Such circuits can require resistors which may not be readily available for implementation in a monolithic fashion. Common approaches to monolithic DAC implementation can require the fabrication of very accurate resistors used in the ladder networks since the actual resistance value of these resistors is critical to the avoidance of errors. These resistors may be of the diffusion or thin film types.

In addition to the resistors in R-2R ladder networks, switching transistors are also required which often consist of large MOS transistors with very small ON resistances. The large size of typical MOS transistors used in this application can significantly decrease the circuit density on a chip, hence increasing the cost.

A number of patents may be of interest in connection with the technology discussed above, including the following: U.S. Pat. Nos. 5,043,731; 4,713,649; and 4,703,302. Also the book, Bipolar and MOS Analog Integrated Circuit Design by Alan Grebene, Wiley, Interscience, pp 456–462, p 759, and pp771–774, may be of interest relative to this prior art.

SUMMARY OF THE INVENTION

There is disclosed a highly efficient general use Digital-to-Analog Converter (DAC) and the use of this DAC in one application in conjunction with a Gilbert multiplier circuit to obtain the product of a binary-weighted digital word $V_{dig}$ and a continuous analog signal $V_{sig}$.

More specifically, an efficient, monolithic, low power, digital-to-analog converter (DAC) addresses some of the negative aspects mentioned in the prior art discussion above, namely the need for very accurate resistors and separate switching transistors. The goal is to use an efficient MOS transistor element in a fashion which serves both the switching and resistive current division functions simultaneously. This allows a R-2R type ladder network to be built with straightforward MOS transistors which can both switch and accurately divide current among the branches of the ladder network.

There exists a circuit often used for the multiplication of two analog signals, where in this case one of the signals $V_{dig}$ represents the discrete levels for a binary-weighted digital word and the other being a continuous analog signal $V_{sig}$, is described. For this application the so called four-quadrant multiplier, or Gilbert multiplier, accomplishes the task of producing an output which is equivalent to the product of two input signals $V_{dig}$ and $V_{sig}$. The DC transfer function for the Gilbert multiplier circuit turns out to be the product of the two hyperbolic tangents for the two input signals. As a result, in order to maintain linearity over the voltage operating range, for the case where the amplitude of the two input voltages is relatively large, it is necessary to include appropriate nonlinearity, or pre-distortion, in the circuit to compensate for this hyperbolic tangent function. It is therefore one of the objectives of this patent to also utilize the DAC to both convert the digital word input $V_{dig}$ to an analog signal and also as an element in generating the nonlinear inverse hyperbolic tangent function for the $V_{dig}$ signal.

The DAC circuit of the invention makes an extremely efficient use of components by using MOS transistors in the circuit to serve both the switching and resistive functions found separately in a conventional DAC. In addition, only two sizes of MOS transistors are required to accomplish the R-2R current dividing function and the W/L ratios for the two size of transistors are most reasonable, making this circuit very compatible for monolithic implementation. This results in a cost effective approach to DAC manufacturing technology.

DESCRIPTION OF THE PREFERRED EMBODIMENT

Figure 1:
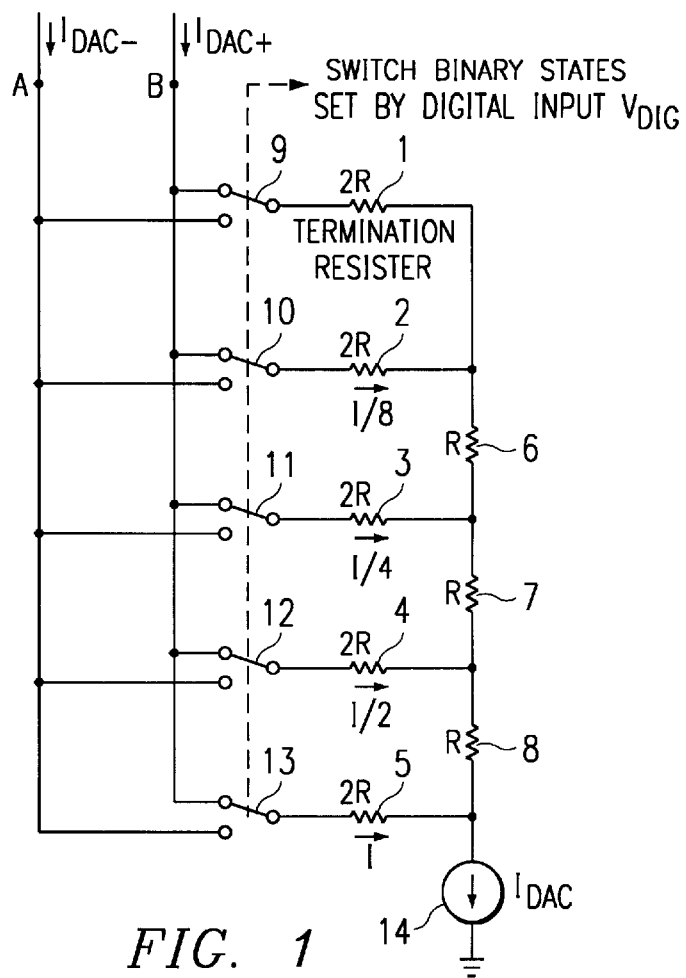
FIG. 1 shows a circuit diagram for a R-2R resistive ladder network.

Disclosed in this patent is a highly efficient DAC which is compatible with MOS design rules and processes. The DAC circuit is built around a R-2R type ladder network which is implemented using only MOS transistors. Although DAC's implemented with R-2R ladder networks are extensively used in binary applications, other than power of two resistors ratios can be used in other than binary applications; for example R-1.5R, R-2.9R, etc. In integrated circuit implementation, it is often preferred to switch currents in the ladder portion of the DAC for the realized speed advantage gained over voltage switching where parasitic stray capacitance can create voltage transients which have to dissipate before the circuit can reach its final state; see the textbook, Bipolar and MOS Analog Integrated Circuit Design, p759. FIG. 1 shows a typical R-2R ladder network used for binary-weighted current division in a 4-bit DAC. This circuit is basically made up of resistors and switches. The 2R resistors 2–5 have twice the resistance of the R elements 6–8 and are wired in the form of a ladder network which is terminated in yet another 2R resistor 1. This circuit divides the current in a binary-weighted manner such that if current flowing through the 2R resistor 5 leg of the most-significant bit is i, then the currents flowing in the other legs of the network will scale in a binary fashion i/2, i/4, i/8, etc. to the least-significant bit. Also ½ the current for the least-significant bit will flow through the termination resistor 1. A set of switches 9–13 is also required to direct the current flowing in the ladder. These switches are controlled by the 1 and 0 states of the digital input word $V_{dig}$ and direct the currents $I_{dac}-$ and $I_{dac}+$ flowing from the input nodes A and B, respectively. In the ladder, there is a constant current Idac flowing through the current source 14 such that for a binary word input represented by all 1's, all the current $I_{dac}$ flows through the $I_{dac}+$ side of the circuit and likewise for the binary word input represented by all 0's, all the current flows through the $I_{dac}-$ side. In a like manner, current flowing in the two inputs $I_{dac}-$ and $I_{dac}+$ is divided proportionally, in a binary fashion, according to the positions of input switches 9–13, which are set by the 1 and 0 level of the digital word $V_1$. It should be noted that there is always current flowing in each leg, being sourced either from $I_{dac}-$ or $I_{dac}+$.

Figure 2:
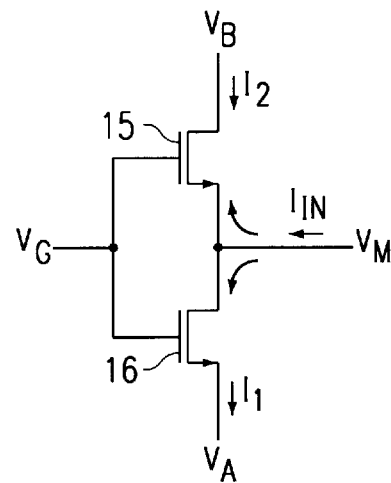
FIG. 2 shows a basic MOS transistor arrangement used for both current division and switching functions.

For monolithic implementation, there is a need for a very efficient DAC which overcomes some of the problems discussed earlier in the prior art; i.e., the requirement for a large number of resistors and transistor switches. One added complication is that large resistors are not the easiest component to make monolithically. This invention reduces the number of parts and eliminates the need for separate resistors by combining the switching and current division functions into one element, an easily manufactured MOS transistor. In a paper by Bult and Geelen, IEEE Journal of Solid-State Circuits, Vol.27, NO 12, December 1992, a transistor pair used for accurately and linearly dividing currents is described. FIG. 2 shows the basic circuit which consists of two n-channel transistors 15 and 16. Here the same MOS transistors are used for both switching and dividing currents without the need for individual resistors. Although a transistor has a nonlinear relation between voltage and current, it is pointed out in this article that the current division function is inherently linear. The current Iin flowing in or out of this circuit is divided into two parts; one part $I_1$ flowing into the node connected to $V_a$ and second part $I_2$ flowing into the node connected to $V_b$. According to the article, based on the current division principles of this circuit, the current flowing in one leg of the circuit is 1. constant and independent of $I_{in}$
2. independent of the value for $V_a$ and $V_b$
3. independent of transistors 15 and 16 being saturated or unsaturated.

These characteristics make the current division process less sensitive to MOS process variations and therefore well suited for LSI implementation. This principle is used to develop an accurate and highly efficient DAC which is compatible with modern MOS processes.

Figure 3A:
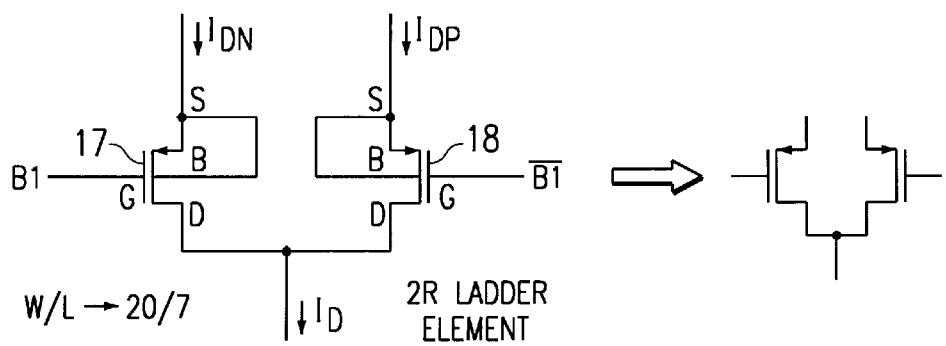
FIG. 3a shows a schematic of the MOS transistor implementation for the basic 2R element used in the R-2R ladder arrangement.

FIG. 3a shows the basic 2R switching and current dividing element for the DAC. This basic 2R element consists of p-channel transistors 17 and 18 with their sources tied to substrate or bulk. In the DAC, only one transistor will be on at a time, allowing current to flow either from $I_{dac}+$ or $I_{dac}-$. The inputs (B1 and $\overline{B1}$) at the gates of transistors 17 and 18 are binary 1 or 0 and used to turn on and off the switches. The drains of transistors 17 and 18 are tied together to form the output of the element where the output current $I_d$ flows.

Figure 3B:
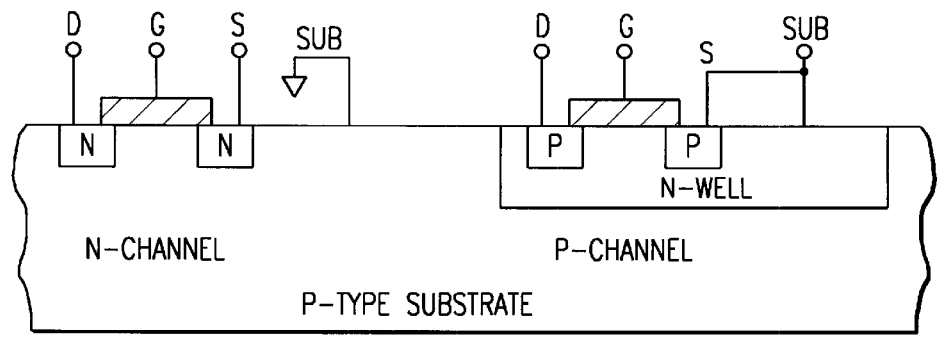
FIG. 3b is a sectional view through a p-channel and a n-channel transistor.

It is sometimes desirable to use p-channel transistors rather than the n-channel devices used in the basic principle presented by Dulk and Geelen as discussed in FIG. 2. As shown in FIG. 3b, by using p-channel transistors with n-well CMOS processing, the substrate bulk and source can be tied together to eliminate any bulk modulation which may otherwise be present. On the other hand, as shown, this would not be the case for a comparable n-channel device where the p-type substrate would be grounded.

Figure 3C:
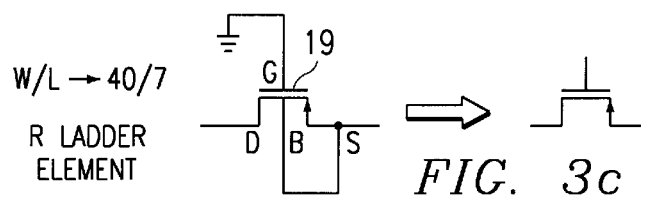
FIG. 3c shows a schematic of the MOS transistor implementation for the basic R element used in the R-2R ladder arrangement.

Likewise, FIG. 3c shows the R resistive element for the ladder network. This is also a p-channel MOS transistor 19 whose gate in this case is tied to ground. In order that all R elements are matched it is also necessary to tie the source and bulk of these transistors, as well.

Figure 4:
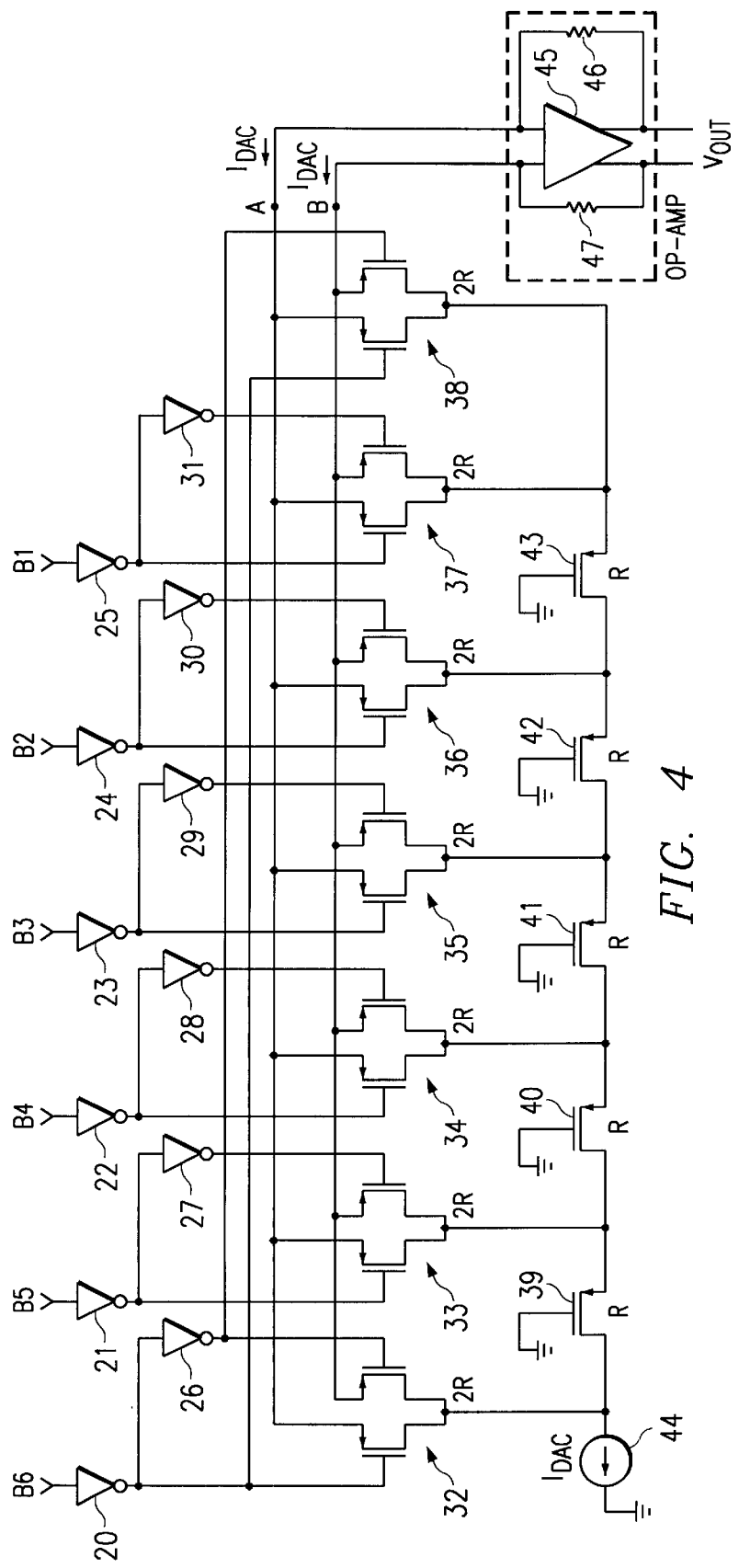
FIG. 4 shows the schematic for the Digital-to-Analog Converter (DAC) with MOS transistors used for both the current division and switching functions.

FIG. 4 shows the overall schematic for a 6-bit DAC with p-channel transistors performing both the switching and current division functions. Transistor pairs 32–37 are the 2R elements. Transistor pair 38 is a 2R termination element which is needed to prevent a ½ bit error in the DAC output. The gates for these transistor pairs are driven by two banks of logic inverters 20–25 and 26–31. The outputs of inverters 20–25 drive one side of the transistor pairs 32–37, as well as the inputs to inverters 26–31. The outputs of inverters 26–31 drive the complementary side of transistor pairs 32–37. Since the outputs of inverter bank 20–25 are tied to the inputs of the other inverter bank 26–31, the inverter banks supply complementary signals to the inputs of the switching transistor pairs. Therefore, for bits having binary 1 levels at the inputs labeled B1–B6, the corresponding transistor pair will have current flowing from the $I_{dac}+$ input and for bits having binary 0 levels at the inputs, current will flow from the $I_{dac}-$ input. P-channel transistors 39–43 make up the R elements in the circuit. Current source 44, labeled $I_{dac}$, assures that constant current flows in the DAC. In this circuit, it is important that the voltages at nodes A and B remain very close in value to each other to assure that the transistors in the DAC operate in the linear region. In one general application of the DAC, an operational amplifier 45, with feedback resistors 46 and 47, are added to both keep these voltages close to each other and to provide an analog output voltage from the DAC.

Figure 5:
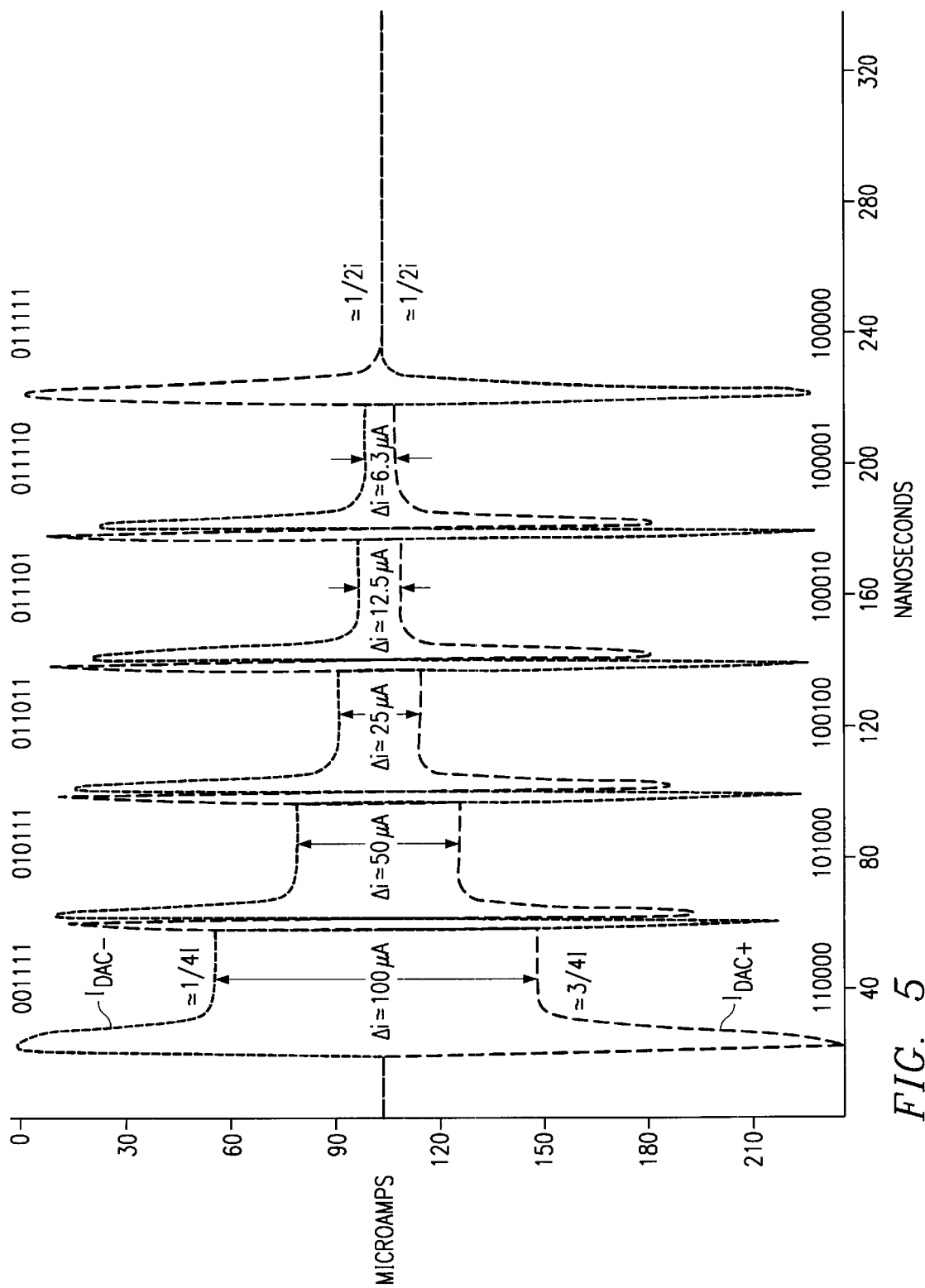
FIG. 5 shows the typical current division within the transistor implemented R-2R type DAC of this invention.

FIG. 5 shows data recorded for the 6-bit DAC discussed above. This shows the currents $I_{dac}+$ and $I_{dac}-$ flowing in the two inputs to the DAC for several binary coded word at inputs B1–B6; 110000, 101000, 100100, 100010, 100001, 100000 and their respective complements 001111, 010111, 011011, 011101, 011110, 011111. To the far right where the most-significant bit is binary 1 and the other bits or binary 0, the currents are equally divided between the two legs at approximately 100 $\mu$A each. At the left end of the plot where the two most-significant bits are binary 1's and the four least-significant bits are binary 0's, the current in the $I_{dac}+$ leg is approximately 150 $\mu$A and that in $I_{dac}-$ is approximately 50 $\mu$A. As can be seen with the other binary inputs, the two currents are divided in a binary-weighted fashion. Since this is a differentially operated circuit, the binary-weighted $\Delta$ currents corresponding to the binary coded input words are also shown in the figure.

Figure 6:
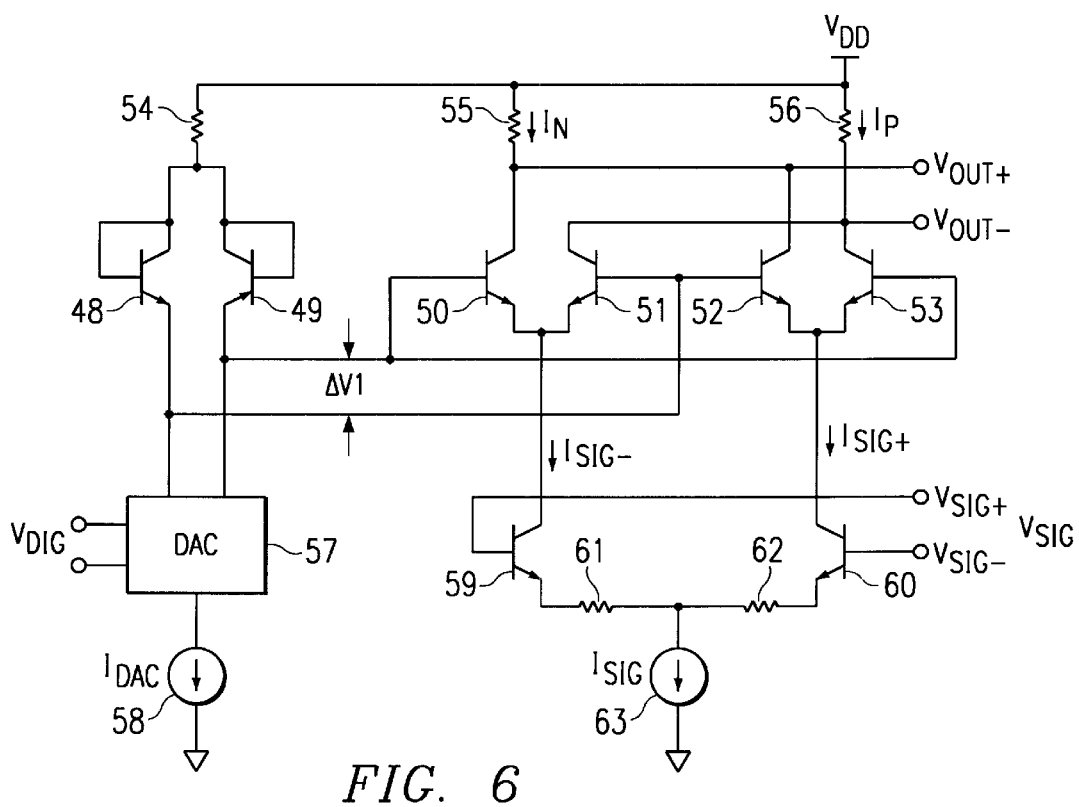
FIG. 6 shows the diagram for a four-quadrant, Gilbert Multiplier.

Another application where the efficient DAC described above is very effective is in the multiplication of a digital word $V_{dig}$ with an analog signal $V_{sig}$. FIG. 6 shows the basic circuit diagram for the four-quadrant Gilbert multiplier 600 used in many integrated circuit multiplier applications and described in the reference textbook Bipolar and MOS Analog Integrated Circuit Design, pp 456–462. The overall multiplier core is made up of the six npn transistors 48–53. In this circuit $V_{out}$ is proportional to the product of the two input signals $V_{dig}$, a digital word, $V_{sig}$ an analog signal and is the result of collector currents $I_n$ and $I_p$ flowing through resistors 55 and 56, respectively. Emitter coupled transistor pairs 50–51 and 52–53 make up the basic four-quadrant multiplier. The outputs of these emitter pairs connect to a differential voltage-to-current converter, used for inserting analog signal $V_{sig}$, which consists of two transistors 59–60, two emitter degeneration resistors 61–62 and a current source 63. As shown in the reference text on p458, for general applications where the voltage drop across resistors 61–62 is large relative to $V_t$, then the relationship between current $\Delta I_{sig}$ and input voltage $V_{sig}$ is shown to be linearly related by $$\Delta I_{sig} = V_{sig}/2R_e$$

where $R_e$ is the value of resistors 61 and 62
and $V_t = kT/q$ = approximately 26 mv at 300° K.

So, analog input voltage $V_{sig}$ has a linear relationship to the currents $I_{sig}-$ and $I_{sig}+$, flowing in the collectors of transistors 59 and 60, respectively and does not require predistortion compensation at its input. On the other hand, there is shown to be a logarithmic relationship between the input signal $V_{dig}$ and the $\Delta I$ output current $I_p-I_n$ of $I_p = I_n * \exp(V_{dig}/V_t)$ and
where $V_t = kT/q$ = approximately 26 mv at 300° K.
and $\Delta I$ is related to $V_{dig}$ as
$\Delta I = I_{sig} * \tanh(V_{dig}/2V')$.

For very small amplitude $V_{dig}$ signals relative to $V_t$, the circuit can perform multiplication accurately, but most practical input signals are much larger than $V_t$ (26 mV) and as a result this logarithmic relationship negatively effects the results. This means that in order to have linear operation of the overall multiplier, there needs to be some predetermined and controlled nonlinearity in the form of a predistortion circuit introduced at input signal $V_{dig}$ to provide an inverse hyperbolic tangent function. This is accomplished by the predistortion circuitry made up of the two diode connected transistors 48–49, the DAC 57, and constant current sources $I_{dac}$ 58. In this circuit the DAC 57, as shown in FIG. 4 minus the operational amplifier, is assumed to develop an output voltage that is linearly related to digital input voltage $V_{dig}$. The two diode-connected transistors 48 and 49 are connected to the $V_{DD}$ voltage source via resistor 54. Differential voltage $\Delta V_1$ at nodes A and B can be shown to perform the desired inverse hyperbolic tangent function on the $V_{dig}$ input signal to assure linear multiplication in the Gilbert multipler. It is important to maintain the voltages at circuit nodes A and B very close in value to each other to assure that the DAC transistors operate in the linear region. In this predistortion circuit, even if currents $I_{dac}+$ and $I_{dac}-$ vary, the $V_{be}$ across the two diode connect transistors 48 and 49 will not vary much, due to the existing logarithmic relationship, and the voltages at nodes A and B will remain close to each other. Referring to the referenced text above, p461–462, it is shown that the output current $\Delta I$ for the multiplier is $$\Delta I = I_p - I_n = K * (\Delta I_{dac} * \Delta I_{sig})/(I_{dac}+ + I_{dac}-)$$

and $A \Delta V_{out} = \Delta I * 2R_L$
where $R_L$ represents load resistors 55 and 56.

Figure 7:
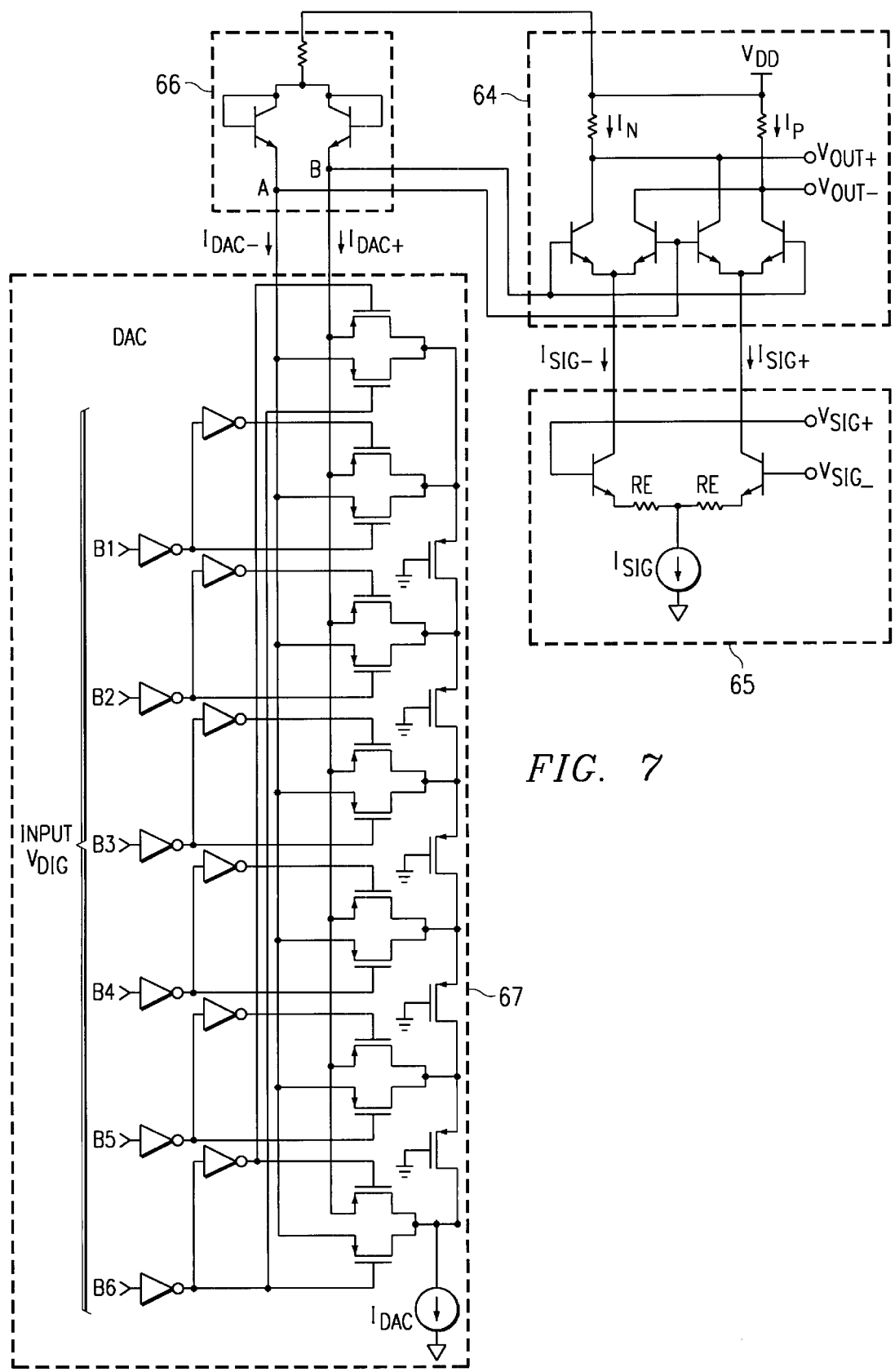
FIG. 7 shows an overall schematic of the Gilbert Multiplier application with the DAC as part of the pre-distortion circuit.

Although the DAC presented in this patent may be used in any number of applications, FIG. 7 shows the complete circuit for the Gilbert multiplier application discussed above. Here the four-quadrant Gilbert Multiplier 64 is shown connected to a differential voltage-to-current converter 65 where the $V_{sig}$ analog signal is input and to a pre-distortion circuit 66 and DAC 57 where the $V_{dig}$ binary-coded signal is input. In this circuit both $V_{dig}$ and $V_{sig}$ voltages are converted into equivalent currents and then multiplied to provide a differential output signal $V_{out+}$ and $V_{out-}$. In this application, it is important that the MOS transistors in the DAC 67 operate in the linear region and drain-to-source $V_{ds}$ voltages remain large. As discussed earlier, due to the logarithmic relation between voltage and current in the pre-distortion circuit 66, the voltage at nodes A and B will always remain very close to each other and this in turn will assure that the transistors operate in the linear region. Even for the case of all binary one's (111111) or all binary zero's (000000), where all the current in flowing in one side or other of the circuit, the voltages at A and B will remain close to each other and the product of the binary-weighted word $V_{dig}$ and $V_{sig}$ will be accurate.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A digital to analog converter comprising:
   (a) two current paths,
   (b) at least two resistances, one resistance in each of said two current paths, each of said two resistances having a first terminal coupled to a switch for selectively coupling said first terminal to one or the other of said two current paths, the second terminal of each of said two resistances being operatively coupled to a constant current source, and
   (c) each of said two resistances and its associated switch being comprised of a pair of transistors, one current carrying terminal of each of said transistors being operatively coupled to said constant current source, a second current carrying terminal of the first of said transistors being operatively coupled to one of said two current paths and an second current carrying terminal of the second of said transistors being operatively coupled to the second of said two current paths.

2. The converter of claim 1 further comprising a circuit operatively coupling a bit of the digital word to be converted to the control terminal of one of said pair of transistors and the inverse of said bit to the control terminal of the other of said pair of transistors.

3. The converter of claim 2 further comprising a transistor connected between said second terminals of a pair of said at least two resistances.

4. A multiplier circuit for forming the product of an analog signal and a digital signal, said multiplier circuit comprising:

(a) a Gilbert multiplier having an analog signal as a first input thereto, and
(b) a digital to analog converter having a digital input signal and providing a second input to said Gilbert multiplier, said analog converter further comprising:
(c) two current paths,
(d) at least two resistances, one resistance in each of said two current paths, each of said two resistances having a first terminal coupled to a switch for selectively coupling said first terminal to one or the other of said two current paths, the second terminal of each of said two resistances being operatively coupled to a constant current source, each of said two resistances and its associated switch being comprised of a pair of transistors, one current carrying terminal of each of said transistors being operatively coupled to said constant current source, a second current carrying terminal of the first of said transistors being operatively coupled to one of said two current paths and a second current carrying terminal of the second of said transistors being operatively coupled to a second of said two current paths, and
(e) a circuit operatively coupling a bit of said digital signal to the control terminal of one of said pair of transistors and the inverse of said bit to the control terminal of the other of said pair of transistors.

* * * * *